United States Patent [19]

Ogata

[11] Patent Number: 5,055,911
[45] Date of Patent: Oct. 8, 1991

[54] SEMICONDUCTOR DEVICE PACKAGE UTILIZING A SOLDER FLOW PREVENTION WALL

[75] Inventor: Toshikazu Ogata, Itami, Japan

[73] Assignee: Mitsubishi Denki Kabushiki Kaisha, Japan

[21] Appl. No.: 558,467

[22] Filed: Jul. 27, 1990

[30] Foreign Application Priority Data

Feb. 27, 1990 [JP] Japan ................................ 2-44424

[51] Int. Cl.5 ............... H01L 23/02; H01L 23/12; H01L 39/02
[52] U.S. Cl. ................................. 357/74; 357/80
[58] Field of Search ................... 357/74, 75, 80, 79, 357/81

[56] References Cited

U.S. PATENT DOCUMENTS

| 4,067,040 | 1/1978 | Tsuzuki et al. ............... 357/74 |
| 4,451,845 | 5/1984 | Philofsky et al. ............. 357/75 |
| 4,672,417 | 6/1987 | Sugiyama et al. ............. 357/75 |
| 4,692,789 | 9/1987 | Nakamura et al. ............. 357/75 |

Primary Examiner—Andrew J. James
Assistant Examiner—Carl Whitehead, Jr.
Attorney, Agent, or Firm—Leydig, Voit & Mayer

[57] ABSTRACT

A semiconductor package includes a base body, metallized layers formed on the base body and having a die-pad area and a wire bonding area, a solder flow prevention wall which is formed on the metallized layers between the die-pad area and a wire bonding area preventing solder from flowing to the wire bonding area while a semiconductor chip is being soldered to the die-pad area.

10 Claims, 4 Drawing Sheets

SEMICONDUCTOR DEVICE PACKAGE UTILIZING A SOLDER FLOW PREVENTION WALL

BACKGROUND OF THE INVENTION

1. Field of the Invention

The present invention relates to a semiconductor package and, in particular, to a package for preventing solder from flowing at bonding in the process of fabricating semiconductor devices.

2. Description of the Related Art

FIG. 5 is a perspective view illustrating a conventional semiconductor device. A base ceramic member 1 is positioned on a heat radiating board 8. A frame ceramic member 5 having an opening 5a is positioned on the base ceramic member 1. Metallized layers 12a and 12b are formed on the frame ceramic member 5. Leads 6a and 6b are disposed on the metallized layers 12a and 12b respectively. Metallized layers 2 and 14 are formed on the base ceramic member 1 inside the opening 5a of the frame ceramic member 5 and a semiconductor chip 9 is mounted on the metallized layer 2 with solder 10. Numeral 11 denotes a fine metallic wire.

A section of the mounted semiconductor chip 9 is shown in FIG. 6. An Au-plated layer 4 is formed on the metallized layer 2 which is positioned on the base ceramic member 1 via an Ni-plated layer 3. The semiconductor chip 9 is fixedly mounted on the Au-plated layer 4 by the solder 10.

The semiconductor devices described above are manufactured in the following way. First, ceramics such as beryllia are metallized to form metallized layers 2 and 14 in arbitrary patterns Then, by baking these layers, the base ceramic member 1 is formed. At this time, the metallized layer 14 reaches the rear surface of the base ceramic member 1. Next, the Ni-plated layer 3 is formed on the metallized layers 2 and 14 as a surface preparation, then the frame ceramic member 5 and the heat radiating board 8 are brazed on the Ni-plated layer 3. Further, the Au-plated layer 4 or an Ag-plated layer is formed on the Ni-plated layer 3 positioned in a die-pad area 13 and a wire bonding area, thus manufacturing a package. The semiconductor chip 9 is fixedly mounted on the die-pad area 13 of this package by the solder 10 and a fine metallic wire 11 is bonded to the required portions. Then the package is sealed, completing the fabrication of the semiconductor device.

However, since the semiconductor chip 9 is carried on board, as shown in FIG. 6, generally, an extension of the solder 10 called solder flow occurs on the die-pad area 13. For this reason, the fine metallic wire 11 for electrically connecting a bottom-surface electrode of the semiconductor chip 9 has to be bonded onto the solder flow. It is known that the adhesion force of the fine metallic wire 11 bonded onto the solder flow is very weak, and there is the possibility that the fine metallic wire 11 will be separated from the solder flow due to thermal stress during use or the like, causing a defective connection. Also, bonding may sometimes be impossible.

As described above, a conventional semiconductor package has a problem in that reliability decreases as the result of solder flow.

SUMMARY OF THE INVENTION

The present invention has been devised to solve the above-mentioned problems. Accordingly, an object of the present invention is to provide a semiconductor package that prevents a loss of reliability as a result of solder flow.

The semiconductor package of the present invention comprises a base body, metallized layers formed on the base body and having a die-pad area and a wire bonding area, and a solder flow prevention wall formed on the metallized layers between the die-pad area and a wire bonding area which prevents solder from flowing to the wire bonding area when at least one semiconductor chip is mounted on the die-pad area.

In the semiconductor package of the present invention, the solder flow prevention wall formed on the metallized layer prevents solder from flowing to the wire bonding area when a semiconductor chip is mounted on the die-pad area.

These and other objects, features and advantages of the present invention will become clear in the following description of the preferred embodiment of the present invention, together with reference to the accompanying drawings.

DESCRIPTION OF THE PREFERRED EMBODIMENTS

An embodiment of the present invention will be explained hereinunder with reference to the accompanying drawings.

Figure 1:
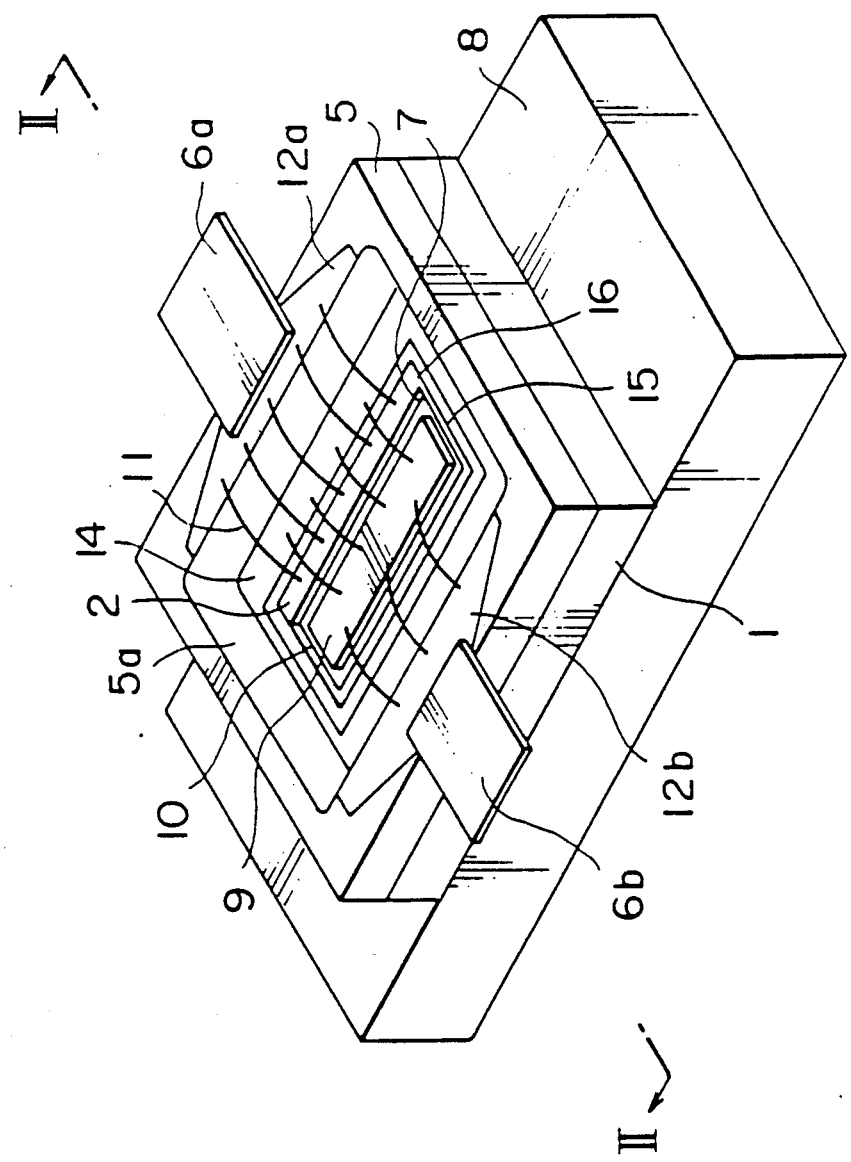
FIG. 1 is a perspective view illustrating a semiconductor device including a semiconductor package according to one embodiment of the present invention.

In FIG. 1, a base ceramic member 1 is disposed on a heat radiating board 8 composed of Cu, etc., and a frame ceramic member 5 having an opening 5a is disposed on the base ceramic member 1. Metallized layers 12a and 12b are formed on the frame ceramic member 5. Leads 6a and 6b are disposed on the metallized layers 12a and 12b respectively. Metallized layers 2 and 14 are formed on the base ceramic member 1 facing the opening 5a of the frame ceramic member 5 and a ridge-shaped solder flow prevention wall 7 is formed on the metallized layer 2. The metallized layer 2 is divided into a die-pad area 15 and a wire bonding area 16 by the solder flow prevention wall 7 and a semiconductor chip 9 is mounted on the die-pad area 15 by a solder 10. In addition, fine metallic wires 11 are connected between the electrodes on the semiconductor chip 9 and the metallized layers 12b and 14, and between the wire bonding area 16 of the metallized layer 2 and the metallized layer 12a.

Figure 2:
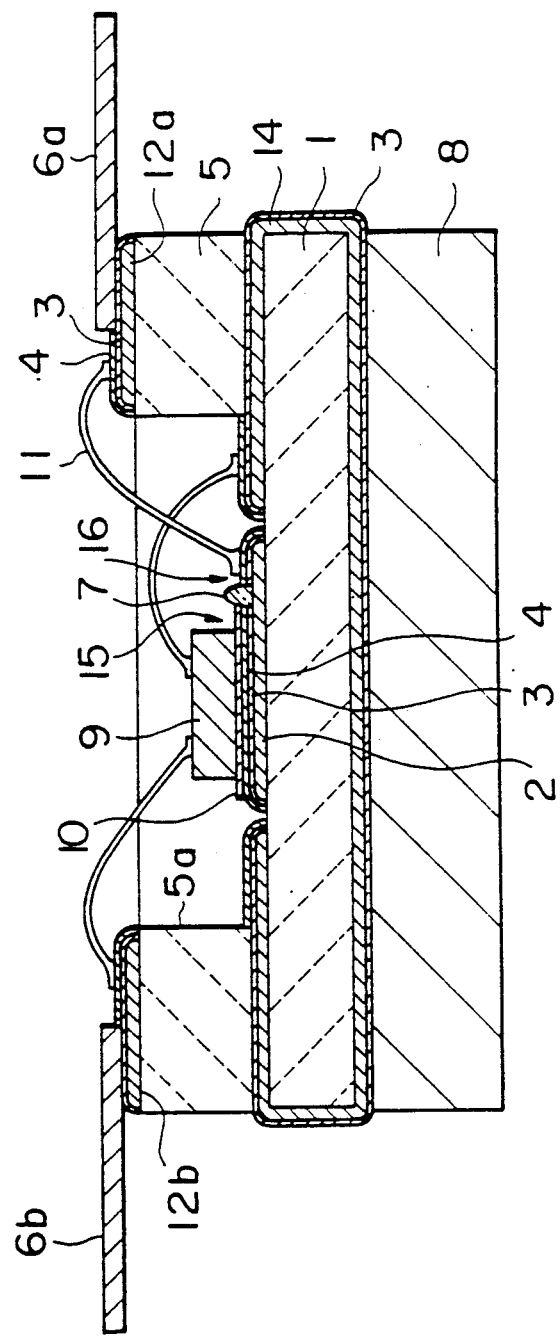
FIG. 2 is a cross-sectional view taken along the II—II line of FIG. 1.

As shown in FIG. 2, the metallized layer 14 reaches the rear surface of the base ceramic member 1 and covers the base ceramic member 1. A Ni-plated layer 3 is formed on each of the metallized layers 2, 12a, 12b and 14 as a surface preparation. The metallized layers 2 and 14 facing the opening 5a of the frame ceramic member 5 and the metallized layers 12a and 12b formed on the frame ceramic member 5 are covered by Au-plated layer 4 formed on the Ni-plated layer 3.

The solder flow prevention wall 7 on the metallized layer 2 is formed of glass and projects on the Au-plated layer 4. The semiconductor chip 9 is fixedly mounted, with the solder 10, on the Au-plated layer 4 of the die-pad area 15 divided by the solder flow prevention wall 7. This solder 10 exists only in the die-pad area 15 and does not reach the wire bonding area 16. That is, in the wire bonding area 16, the fine metallic wire 11 is directly bonded onto the Au-plated layer 4.

Such a semiconductor device is manufactured as follows. First, ceramics such as beryllia are metallized to form metallized layers 2 and 14 of arbitrary patterns. Then, by baking these layers, the base ceramic member 1 is formed. Next, a glass of the composition $SiO_2$, $Al_2O_3$, etc. is applied to the metallized layer 2 in a linear form and baked, forming the solder flow prevention wall 7. In the same way as for the base ceramic member 1, also, the frame ceramic member 5 having metallized layers 12a and 12b is formed.

Next, the Ni-plated layer 3 is formed, as a surface preparation, on each of the metallized layers 2, 12a, 12b and 14. Then the frame ceramic member 5 and the heat radiating board 8 are brazed on the Ni-plated layer 3 of the base ceramic member 1 and leads 6a and 6b are brazed on the Ni-plated layer 3 of the frame ceramic member 5.

Next, the metallized layers 2 and 14 positioned inside the opening 5a of the frame ceramic member 5 and the metallized layers 12a and 12b are covered by the Au-plated layer 4 or an Ag-plated layer formed on the Ni-plated layer 3, thus manufacturing a semiconductor device.

The semiconductor chip 9 is mounted on the die-pad area 15 of this semiconductor device by the solder 10, and since the solder flow prevention wall 7 exists at this time, the solder 10 is prevented from flowing to the wire bonding area 16. Then, the fine metallic wires 11 are connected between the electrodes on the semiconductor chip 9 and the metallized layers 12b and 14, and between the wire bonding area 16 of the metallized layer 2 and the metallized layer 12a. In addition, the package is sealed and the fabrication of a packaged semiconductor device is completed.

As has been explained above, in the semiconductor package of this embodiment, since the surface of the Au-plated layer 4 on the metallized layer 2 is divided into the die-pad area 15 and the wire bonding area 16 by the solder flow prevention wall 7, the solder 10 is prevented from flowing to the wire bonding area 16 and the fine metallic wire 11 can be bonded directly onto the Au-plated layer 4 of the wire bonding area 16. Therefore, bonding reliability becomes higher.

The solder flow prevention wall 7 has the advantage that it readily takes an arbitrary form and does not change in quality even if it is heated, because it is formed by baking glass. Also, the solder flow prevention wall 7 can be formed by solidifying ceramic or glass powders using an adhesive.

In addition, the solder flow prevention wall 7 can be utilized as an indicator of alignment at the time of die bonding or wire bonding, and therefore it is useful in automated semiconductor device manufacture.

Figure 3:
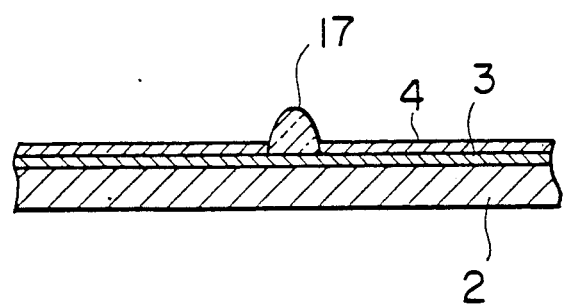
FIGS. 3 and 4 are partially sectional views respectively illustrating another embodiments.
Figure 4:
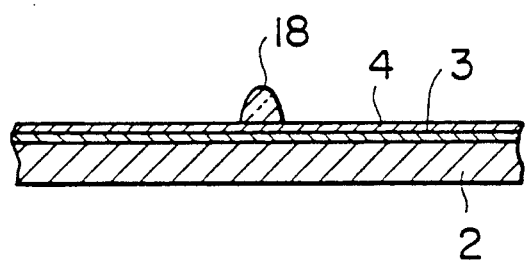
Figure 5:
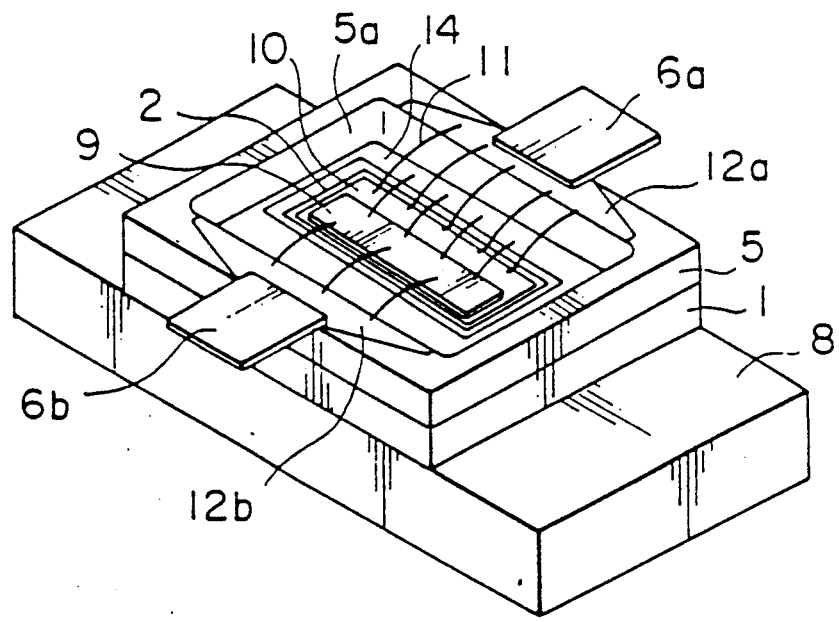
FIG. 5 is a perspective view illustrating a semiconductor device in which a conventional semiconductor package is used.
Figure 6:
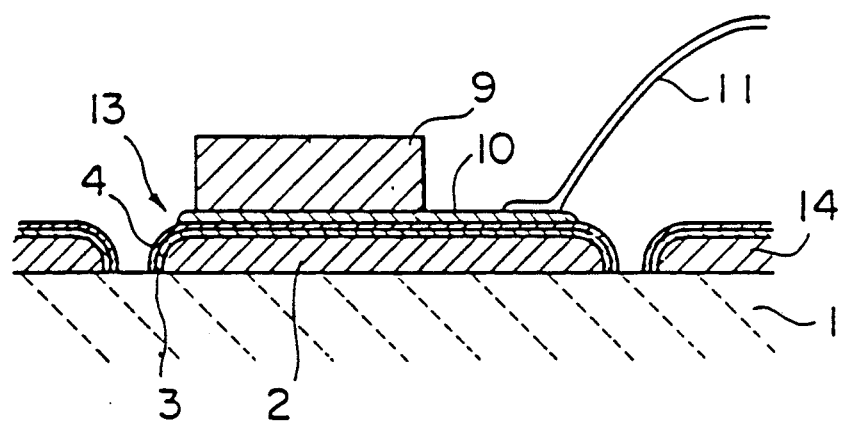
FIG. 6 is a cross-sectional view of a semiconductor chip mounted in the package of FIG. 5.

In the above-mentioned embodiment, the solder flow prevention wall 7 is directly formed on the metallized layer 2. However, a solder flow prevention wall 17 may be formed on the Ni-plated layer 3, as shown in FIG. 3, or a solder flow prevention wall 18 may be formed on the Au-plated layer 4, as shown in FIG. 4.

Many widely different embodiments of the present invention can be made without departing from the spirit and scope thereof, therefore it is to be understood that this invention is not limited to the specific embodiments described but by the appended claims.

What is claimed is:

1. A semiconductor package comprising:
   a base body;
   a metallized layer disposed on said base body and including a die-pad area for mounting a semiconductor chip by soldering and a wire bonding area for bonding wires;
   a solder flow prevention wall disposed on said metallized layer separating said die-pad area from said wire bonding area; and
   metal layers respectively disposed on said die-pad area and said wire bonding area separated by said solder flow prevention wall wherein said solder flow prevention wall protrudes from said metallized layer and beyond said metal layers to form a barrier stopping molten solder from flowing to said wire bonding area from said die bonding area when a semiconductor chip is being soldered to said die-pad area.

2. A package according to claim 1, wherein said solder flow prevention wall is glass.

3. A package according to claim 1, wherein said base body is a ceramic.

4. A package according to claim 3, further comprising:
   a ceramic frame positioned on said base body and having an opening for accommodating said die-pad area and said wire bonding area; and
   a plurality of leads positioned on said frame.

5. A package according to claim 1, wherein said electrode layer is Au.

6. A package according to claim 1, wherein said electrode layer is an Ag.

7. A semiconductor package comprising:
   a base body;
   a metallized layer disposed on said base body and including a die-pad area for mounting a semiconductor chip by soldering and a wire bonding area for bonding wires;
   a metallic surface preparation layer disposed on said metallized layer on said die-pad area and on said wore bonding area;
   a solder flow prevention wall disposed on said surface preparation layer separating said die-pad area from said wire bonding area; and
   a metal electrode layer disposed on said surface preparation layer on said die-pad area and said wire bonding area wherein said solder flow prevention wall protrudes from said surface preparation layer and beyond said electrode layer to form a barrier stopping molten solder from flowing to said wire bonding area from said die bonding area when a semiconductor chip is being soldered to said die-pad area.

8. A package according to claim 7 wherein said solder flow prevention wall is glass.

9. A semiconductor package comprising:
   a base body;
   a metallized layer disposed on said base body and including a die-pad area for mounting a semiconductor chip by soldering and a wire bonding area for bonding wires;

a metallic surface preparation layer and a metal electrode layer successively disposed on said metallized layer on said die-pad area and on said wore bonding area; and a solder flow prevention wall disposed on said electrode layer separating said die-pad area from said wire bonding area wherein said solder flow prevention wall protrudes from said electrode layer to form a barrier stopping molten solder from flowing to said wire bonding area from said die bonding area when a semiconductor chip is being soldered to said die-pad area.

10. A package according to claim 9 wherein said solder flow prevention wall is glass.

* * * * *